(12) United States Patent
Kang

(10) Patent No.: US 12,477,959 B2
(45) Date of Patent: Nov. 18, 2025

(54) RESISTIVE MEMORY DEVICE AND MANUFACTURING METHOD OF THE RESISTIVE MEMORY DEVICE

(71) Applicant: SK hynix Inc., Icheon-si Gyeonggi-do (KR)

(72) Inventor: In Ku Kang, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 492 days.

(21) Appl. No.: 17/836,426

(22) Filed: Jun. 9, 2022

(65) Prior Publication Data

US 2023/0240157 A1 Jul. 27, 2023

(30) Foreign Application Priority Data

Jan. 21, 2022 (KR) .................. 10-2022-0009498

(51) Int. Cl.
*H10N 70/00* (2023.01)
*H10B 63/00* (2023.01)

(52) U.S. Cl.
CPC .......... *H10N 70/063* (2023.02); *H10B 63/84* (2023.02); *H10N 70/023* (2023.02); *H10N 70/028* (2023.02)

(58) Field of Classification Search
CPC .................................................. H10N 70/826
See application file for complete search history.

(56) References Cited

U.S. PATENT DOCUMENTS

| | | | |
|---|---|---|---|
| 2013/0334594 A1* | 12/2013 | Imonigie | H10B 43/35 257/326 |
| 2014/0145137 A1 | 5/2014 | Ju et al. | |
| 2020/0227318 A1* | 7/2020 | Kawasaki | H01L 21/76849 |
| 2021/0111340 A1* | 4/2021 | Yang | H10N 70/066 |
| 2021/0408121 A1* | 12/2021 | Fantini | H10N 70/8828 |
| 2022/0077235 A1* | 3/2022 | Kim | H10N 70/061 |

FOREIGN PATENT DOCUMENTS

| | | |
|---|---|---|
| KR | 1020140068627 A | 6/2014 |
| KR | 1020210100388 A | 8/2021 |
| KR | 1020210106288 A | 8/2021 |
| KR | 1020210106295 A | 8/2021 |

\* cited by examiner

*Primary Examiner* — Mounir S Amer
(74) *Attorney, Agent, or Firm* — WILLIAM PARK AND ASSOCIATES LTD.

(57) ABSTRACT

There are provided a resistive memory device and a manufacturing method of the resistive memory device. The resistive memory device includes: a stack structure in which a plurality of interlayer insulating layers and a plurality of conductive layers are alternately stacked; a hole penetrating the stack structure in a vertical direction; and a gate insulating layer, a channel layer, and a variable resistance layer, formed along sidewalls of the plurality of conductive layers, which are adjacent to the hole, and sidewalls of the plurality of interlayer insulating layers, which are adjacent to the hole.

10 Claims, 20 Drawing Sheets

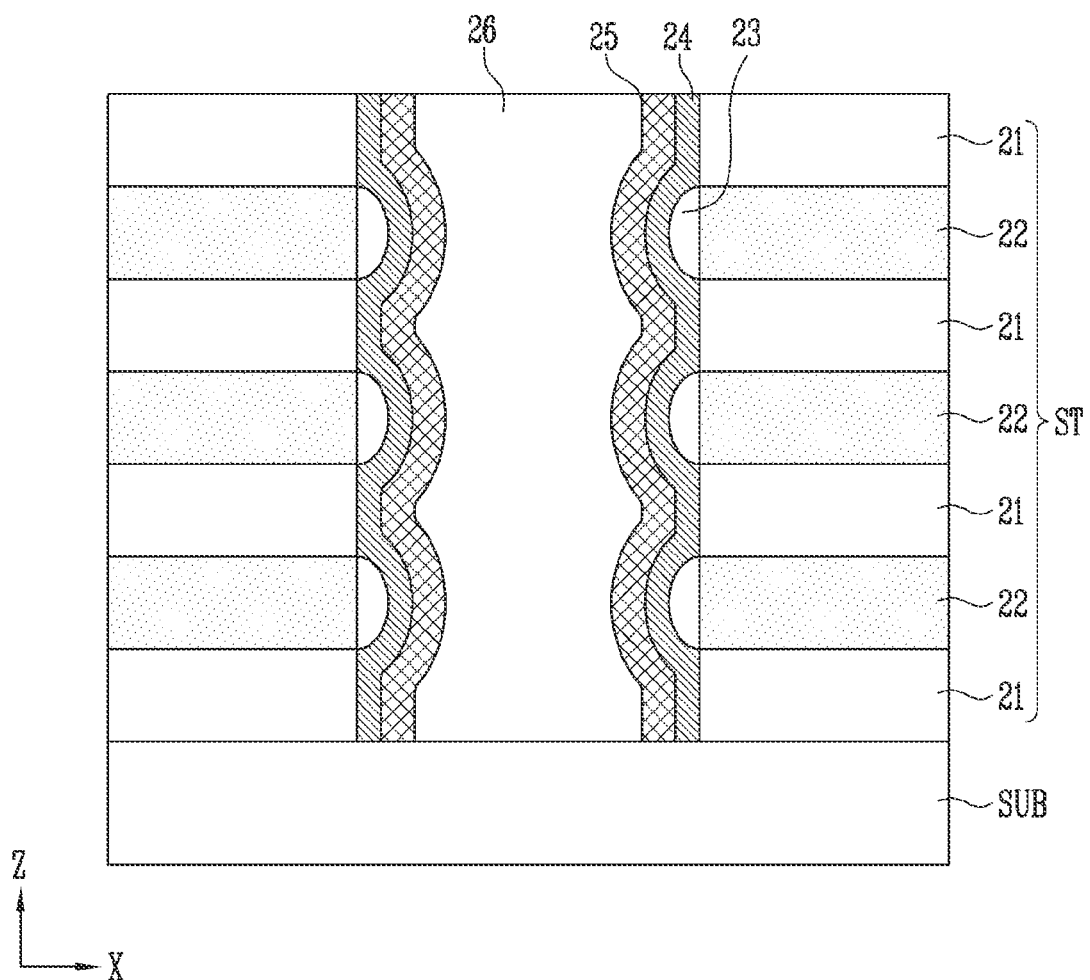

RESISTIVE MEMORY DEVICE AND MANUFACTURING METHOD OF THE RESISTIVE MEMORY DEVICE

CROSS-REFERENCE TO RELATED APPLICATION

The present application claims priority under 35 U.S.C. § 119(a) to Korean patent application number 10-2022-0009498 filed on Jan. 21, 2022, in the Korean Intellectual Property Office, the entire disclosure of which is incorporated by reference herein.

BACKGROUND

1. Technical Field

The present disclosure generally relates to a resistive memory device and a manufacturing method of the resistive memory device, and more particularly, to a resistive memory device in which data can be stored according to a change in resistance, and an operating method of the resistive memory device.

2. Related Art

A memory device may be classified into a volatile memory device in which stored data disappears when the supply of power is interrupted and a nonvolatile memory device in which stored data is retained even when the supply of power is interrupted.

The nonvolatile memory device may include a NAND flash memory, a NOR flash memory, a resistive random access memory (ReRAM), a phase-change random access memory (PRAM), a magnetoresistive random access memory (MRAM), a ferroelectric random access memory (FRAM), a spin transfer torque random access memory (STT-RAM), and the like.

Among these, the ReRAM may store data according to a change in resistance of variable resistance layer. For example, the ReRAM may include a top electrode and a bottom electrode, to which voltages are applied, and include a variable resistance layer located between the top electrode and the bottom electrode, to store data. The variable resistance layer may be programmed to a high resistance state or a low resistance state according to voltages applied to the top electrode and the bottom electrode, and be maintained in the high resistance state or the low resistance state, which is a previous state, until before another voltage is applied to the top electrode or the bottom electrode.

SUMMARY

In accordance with an embodiment of the present disclosure, there is provided a resistive memory device including: a stack structure in which a plurality of interlayer insulating layers and a plurality of conductive layers are alternately stacked; a hole penetrating the stack structure in a vertical direction; and a gate insulating layer, a channel layer, and a variable resistance layer, formed along sidewalls of the plurality of conductive layers, which are adjacent to the hole, and sidewalls of the plurality of interlayer insulating layers, which are adjacent to the hole, wherein the sidewalls of the plurality of interlayer insulating layers, which are adjacent to the hole, include a concave shape.

In accordance with an embodiment of the present disclosure, there is provided a resistive memory device including: a stack structure in which a plurality of interlayer insulating layers and a plurality of conductive layers are alternately stacked; a hole penetrating the stack structure in a vertical direction; gate insulating layers disposed between the hole and the respective plurality of conductive layers; and a channel layer and a variable resistance layer, sequentially formed along sidewalls of the plurality of interlayer insulating layers, which are adjacent to the hole, and sidewalls of the gate insulating layers, which are adjacent to the hole.

In accordance with an embodiment of the present disclosure, there is provided a method of manufacturing a resistive memory device, the method including: forming a hole penetrating, in a vertical direction, a stack structure in which first material layers and second material layers are alternately stacked; forming recess regions by etching sidewalls of the first material layers, which is exposed through the hole, to a certain depth; and forming a gate insulating layer, a channel layer, and a variable resistance layer along a sidewall of the hole including the recess regions.

In accordance with an embodiment of the present disclosure, there is provided a method of manufacturing a resistive memory device, the method including: forming a hole penetrating, in a vertical direction, a stack structure in which first material layers and second material layers are alternately stacked; forming gate insulating layers on sidewalls of the second material layers, which are exposed through the hole; and forming a channel layer and a variable resistance layer along sidewalls of the first material layers, which are exposed through the hole, and sidewalls of the gate insulating layers.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. Like reference numerals refer to like elements throughout.

FIGS. 6A, 6B, 6C, and 6D are sectional views illustrating a manufacturing method of the resistive memory device in accordance with another embodiment of the present disclosure.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Some embodiments provide a resistive memory device and a manufacturing method of the resistive memory device, in which a channel domination force of a transistor is decreased.

Figure 1:
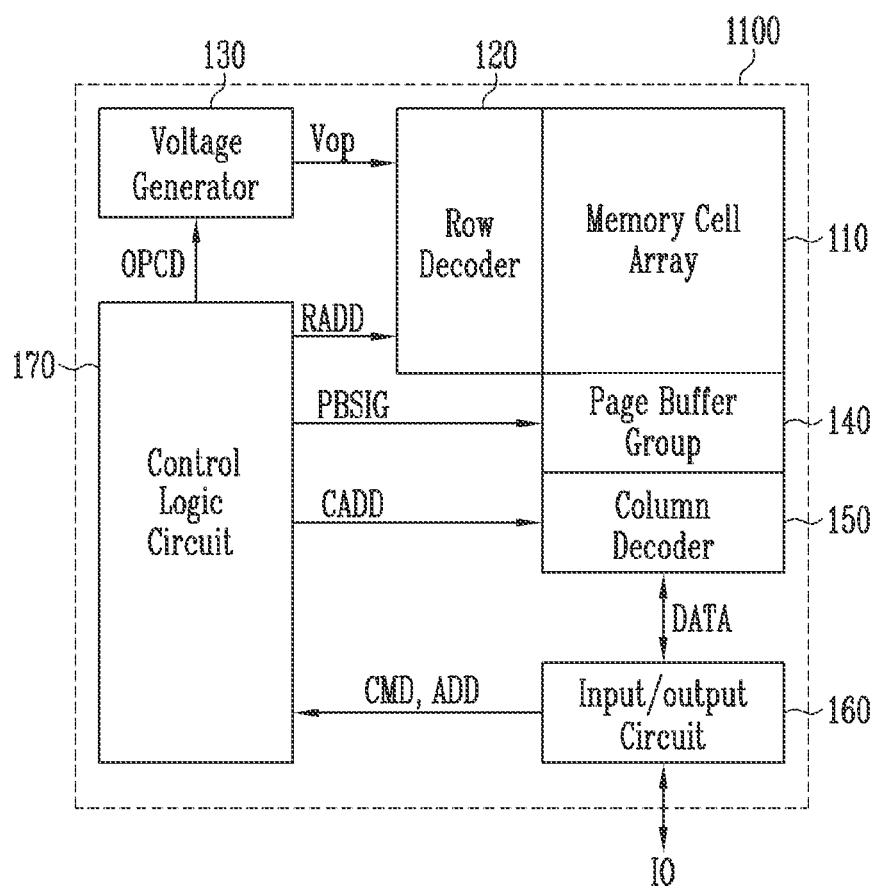
FIG. 1 is a diagram illustrating a resistive memory device in accordance with an embodiment of the present disclosure.

FIG. 1 is a diagram illustrating a resistive memory device in accordance with an embodiment of the present disclosure.

Referring to FIG. 1, the resistive memory device 1100 may include a memory cell array 110 in which data is stored and peripheral circuits 120 to 170 capable of performing a program, read or erase operation.

The memory cell array 110 may include a plurality of memory blocks in which data is stored. Each of the memory blocks may include resistive random access memory cells, and the resistive random access memory cells may be implemented in a three-dimensional structure in which the resistive random access memory cells are stacked in a vertical direction above a substrate. The resistive random access memory cells may be configured such that resistance is changed according to a voltage applied to an electrode.

The peripheral circuits 120 to 170 may include a row decoder 120, a voltage generator 130, a page buffer group 140, a column decoder 150, an input/output circuit 160, and a control logic circuit 170.

The row decoder 120 may select one memory block among the memory blocks included in the memory cell array 110 according to a row address RADD, and transmit operating voltages Vop to the selected memory block.

The voltage generator 130 may generate and output the operating voltages Vop necessary for various operations in response to an operation code OPCD. For example, the voltage generator 130 may generate a set voltage, a reset voltage, a turn-on voltage, a turn-off voltage, a read voltage, an erase voltage, and the like in response to the operation code OPCD, and selectively output the generated voltages. In accordance with this embodiment, the voltage generator 130 may generate voltage of 0V or higher as voltages to be applied to word lines, and might not include a device for generating a negative voltage lower than 0V.

The page buffer group 140 may be connected to the memory cell array 110 through bit lines. For example, the page buffer group 140 may include page buffers connected to the respective bit lines. The page buffers may simultaneously operation in response to page buffer control signals PBSIG, and temporarily store data in a program or read operation. The page buffers may sense a voltage of the bit lines, which varies according to threshold voltages of the memory cells, in a read operation or a verify operation. For example, when resistance of the resistive random access memory cells becomes higher, a current of the bit lines decreases. When the resistance of the resistive random access memory cells becomes lower, the current of the bit lines increases. Therefore, the page buffers may be configured to sense a current of the bit lines, which is changed according to resistance of selected memory cells. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

The column decoder 150 may transmit data DATA between the input/output circuit 160 and the page buffer group 140 according to a column address CADD.

The input/output circuit 160 may be connected to an external device through input/output lines IO. For example, the external device may be a controller capable of transmitting a command CMD, an address ADD, or data DATA to the resistive memory device 1100. The input/output circuit 160 may input/output a command CMD, an address ADD, and data DATA through the input/output lines IO. For example, the input/output circuit 160 may transmit the command CMD and the address ADD, which are received from the external device, to the control logic circuit 170 through the input/output lines IO, and transmit the data DATA received from the external device to the column decoder 150 through the input/output lines IO. The input/output circuit 160 may output the data DATA received from the column decoder 150 to the external device through the input/output lines IO.

The control logic circuit 170 output the operation code OPCD, the row address RADD, the page buffer control signals PBSIG, and the column address CADD in response to the command CMD and the address ADD. For example, the control logic circuit 170 may include software for performing an algorithm in response to the command CMD and hardware for outputting the address ADD and various control signals.

Figure 2:
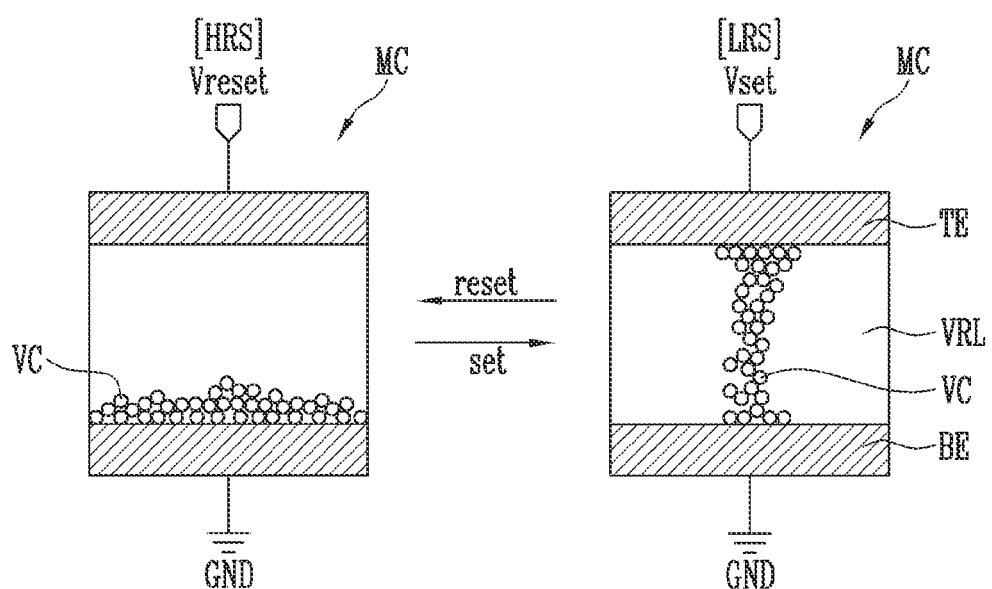
FIG. 2 is a view illustrating a state of a resistive random access memory cell in accordance with an embodiment of the present disclosure.

FIG. 2 is a view illustrating a state of a resistive random access memory cell in accordance with an embodiment of the present disclosure.

Referring to FIG. 2, the resistive random access memory cell MC may include a bottom electrode BE, a top electrode TE, and a variable resistance layer VRL. The bottom electrode BE and the top electrode TE may be formed of a conductive material, and the variable resistance layer VRL may be formed of a variable resistance material.

The bottom electrode BE and the top electrode TE may be formed of any one material or two or more materials among aluminum (Al), copper (Cu), titanium nitride (TiN), titanium aluminum nitride ($Ti_xAl_yN_z$), iridium (Ir), platinum (Pt), silver (Ag), gold (Au), poly-silicon, tungsten (W), titanium (Ti), tantalum (Ta), tantalum nitride (TaN), tungsten nitride (WN), nickel (Ni), cobalt (Co), chromium (Cr), antimony (Sb), iron (Fe), molybdenum (Mo), palladium (Pd), tin (Sn), zirconium (Zr), zinc (Zn), iridium oxide ($IrO_2$), and strontium zirconate oxide ($StZrO_3$).

The variable resistance layer VRL may be formed of a bipolar resistance memory material or a unipolar resistance memory material. The bipolar resistance memory material may become a set or reset state according to different voltage applied to the bottom electrode BE and the top electrode TE. Perovskite-based materials may be used as the bipolar resistance memory material. The unipolar resistance memory material may be programmed to the set or reset state even by a voltage pulse having the same polarity. A transition metal oxide such as nickel oxide ($NiO_x$) or titanium oxide ($TiO_x$), and the like may be used as the unipolar resistance memory material.

Empty spaces of atoms exist in the variable resistance layer VRL, which are referred to as vacancies VC. Since the vacancy VC has a polarity, the vacancy VC may be moved according to voltages applied to the top electrode TE and the bottom electrode BE. For example, when a reset voltage Vreset is applied to the top electrode TE and a ground voltage GND is applied to the bottom electrode BE, the vacancy VC may be moved toward the top electrode TE. The reset voltage Vreset may be a negative voltage lower than 0V. When the vacancies VC are concentrated on the top electrode TE or the bottom electrode BE, any filament is not formed between the top electrode TE and the bottom electrode BE, and therefore, resistance of the variable resistance layer VRL may become high. When the resistance of the variable resistance layer VRL becomes high, the resistive random access memory cell MC becomes a high resistance state HRS, and any current does not flow through the resistive random access memory cell MC due to high resistance.

When a set voltage Vset is applied to the top electrode TE of the resistive random access memory cell MC in the high resistance state HRS and the ground voltage GND is applied to the bottom electrode BE, some of the vacancies VC which have been concentrated on the top electrode TE may be moved to the bottom electrode BE, and therefore, a filament may be formed between the top electrode TE and the bottom electrode BE. When the filament is formed between the top electrode TE and the bottom electrode BE, the resistance of the variable resistance layer VRL becomes low, and therefore, the resistive random access memory cell MC may become a low resistance state LRS. In the resistive random access memory cell MC in the low resistance state LRS, a current may flow through the filament between the top electrode TE and the bottom electrode BE.

That is, in the high resistance state HRS, the resistance of the variable resistance layer VRL increases, and therefore, the current may become low or might not flow. In the low resistance state LRS, the resistance of the variable resistance layer VRL decreases, and therefore, the current may become high. The resistive random access memory cell MC may be programmed or erased to the set or reset state according to a change in resistance state.

Figure 3:
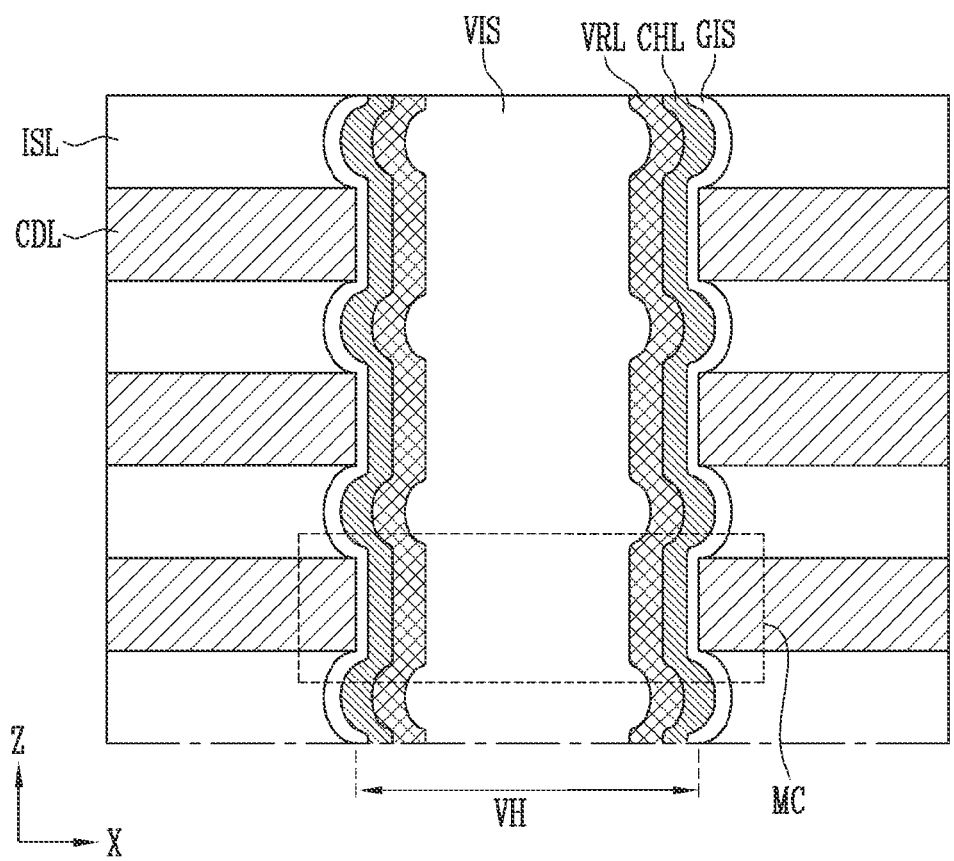
FIG. 3 is a sectional view illustrating a resistive memory device in accordance with an embodiment of the present disclosure.

FIG. 3 is a sectional view illustrating a resistive memory device in accordance with an embodiment of the present disclosure.

Referring to FIG. 3, the resistive memory device may include memory blocks including a plurality of resistive random access memory cells, and a portion of a string included in a memory block is illustrated in FIG. 3.

The string may include a plurality of resistive random access memory cells MC, and the plurality of resistive random access memory cells MC may be connected to conductive layers CDL corresponding to word lines. Interlayer insulating layers ISL may be formed between the conductive layers CDL. The conductive layers CDL and the interlayer insulating layers ISL may extend in an X direction as a direction parallel to a substrate. For example, the interlayer insulating layers ISL and the conductive layers CDL may be alternately stacked on the top of a lower structure (not shown). The lower structure may include the substrate or at least one of a source line, a source select line, and peripheral circuits, which are formed on the substrate. The conductive layers CDL may be used as word lines or select lines. For example, when assuming that the interlayer insulating layers ISL and the conductive layers CDL are alternately stacked on the substrate, the conductive layers CDL may include word lines and drain select lines. The interlayer insulating layers ISL may be formed of oxide, and the conductive layers CDL may be formed of a metal material such as tungsten.

A vertical hole VH penetrating the interlayer insulating layers ISL and the conductive layers CDL in a Z direction as a direction perpendicular to the substrate may be formed in the string, and sidewalls of the interlayer insulating layers ISL, which are adjacent to the vertical hole VH, may have a concave shape. A gate insulating layer GIS, a channel layer CHL, a variable resistance layer VRL, and a vertical insulating layer VIS may be formed inside the vertical hole VH. For example, the vertical hole VH may be formed in a cylindrical shape, and a sidewall of the vertical hole VH may be formed to have uneven portions due to the conductive layers CDL having vertical sidewalls and the interlayer insulating layers ISL having concave sidewalls. That is, the sidewall of the vertical hole VH may have a form in which a plurality of uneven portions are disposed in a vertical direction. The gate insulating layer GIS, the channel layer CHL, and the variable resistance layer VRL may be sequentially stacked on an inner wall of the vertical hole VH. Since the gate insulating layer GIS, the channel layer CHL, and the variable resistance layer VRL are formed along the uneven portion of the vertical hole VH, the gate insulating layer GIS, the channel layer CHL, and the variable resistance layer VRL may be formed in a wave pattern extending in the vertical direction.

In this embodiment, the variable resistance layer VRL may be used as a layer for storing data, and the channel layer CHL may be used to allow a current to flow in the string.

The gate insulating layer GIS and the vertical insulating layer VIS may be formed of oxide. The channel layer CHL may be formed of poly-silicon. At least one of a phase variation material, a perovskite-based material, and a transition metal oxide such as $NiO_x$, $HfO_x$, $TaO_x$, $TiO_x$ or $SiHfO_x$ may be used for the variable resistance layer VRL.

In accordance with the above-described embodiment, the conductive layers CDL respectively corresponding to the resistive random access memory cells MC have a structure in which the conductive layers CDL further protrude toward the vertical hole VH than the interlayer insulating layers ISL, and the channel layer CHL is formed along the protruding conductive layers CDL. Hence, in an embodiment, a channel domination force of one transistor configured with the conductive layer DCL, the gate insulating layer GIS, and the channel layer CHL in one resistive random access memory cell MC is decreased, and accordingly, an effective channel length of the resistive random access memory cell MC can be decreased. Thus, in an embodiment, a bias for a program-erase operation of an element can be decreased, and the variable resistance layers VRL corresponding to the respective resistive random access memory cells MC are physically spaced apart from each other, thereby improving an inter-cell interference phenomenon.

FIGS. 4A to 4D are sectional views illustrating a manufacturing method of the resistive memory device in accordance with an embodiment of the present disclosure.

Figure 4A:
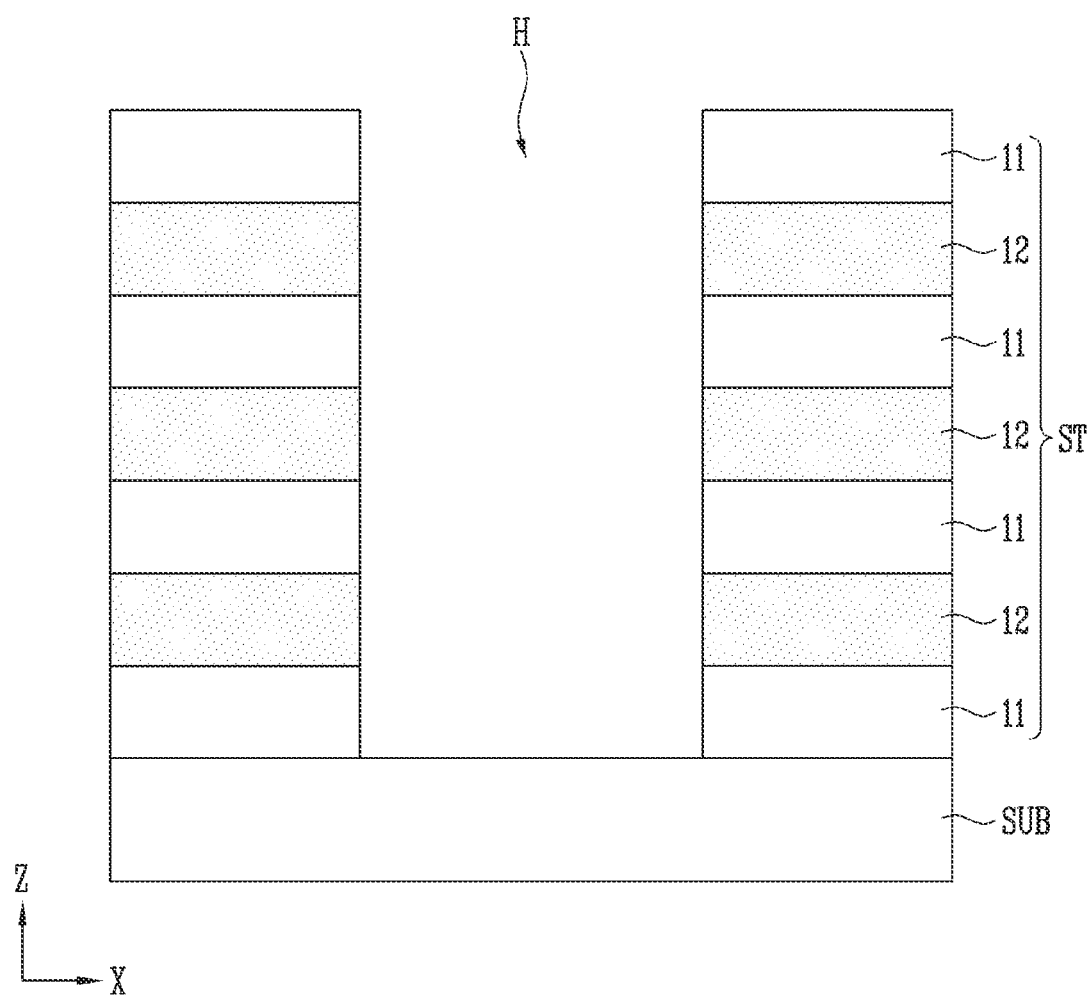
FIGS. 4A, 4B, 4C, and 4D are sectional views illustrating a manufacturing method of the resistive memory device in accordance with an embodiment of the present disclosure.

Referring to FIG. 4A, a stack structure ST is formed on a substrate SUB. The stack structure ST may include first material layers 11 and second material layers 12, which are alternately stacked. The first and second material layers 11 and 12 may extend in a first direction X as a direction horizontal to the substrate SUB. The first and second material layers 11 and 12 may be stacked in a second direction Z as a direction perpendicular to the substrate SUB. The first and second material layers 11 and 12 may be formed by using a deposition process such as Chemical Vapor Deposition (CVD).

The first material layers 11 may include a material having a high etch selectivity with respect to the second material layers 12. In an example, the first material layers 11 may include an insulating material such as oxide, and the second material layers 12 may include a sacrificial material such as nitride. In another example, the first material layers 11 may include an insulating material such as oxide, and the second material layers 12 may include a conductive material such as poly-silicon, tungsten, molybdenum or metal.

Subsequently, a hole H may be formed, which penetrates the stack structure ST. The hole H may have a cylindrical shape extending in the second direction Z.

Figure 4B:
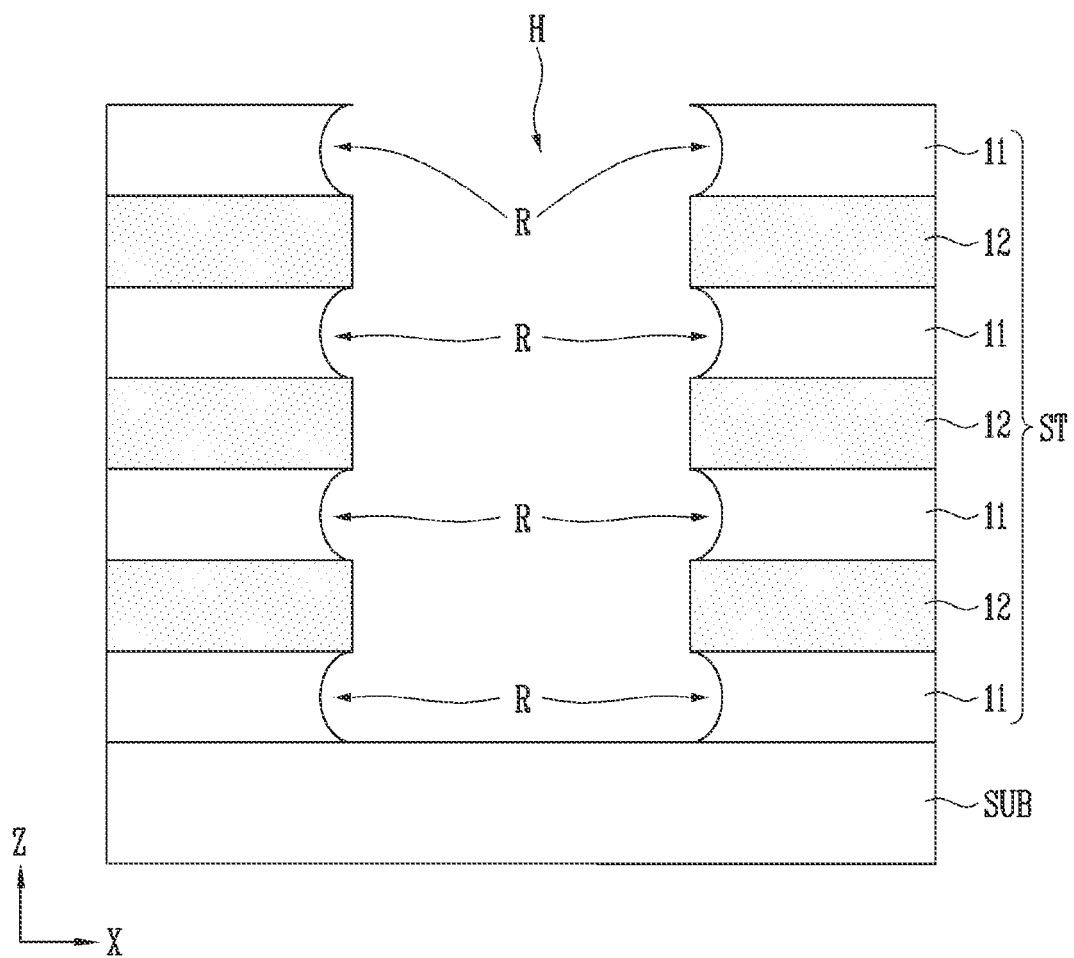

Referring to FIG. 4B, recess regions R are formed by etching sidewalls of the first material layers 11, which are exposed through the hole H, to a certain depth. That is, the sidewalls of the first material layers 11 are etched to a certain depth such that the second material layers 12 further protrude in a horizontal direction than the first material layers 11. The sidewalls of the first material layers 11 may be concavely etched in a round shape. For example, in an embodiment, the sidewalls of the first material layers 11 may be concavely etched in a round shape as shown in FIG. 4B. Therefore, a sidewall of the hole H may be formed in a structure in which uneven portions are sequentially disposed in the second direction Z as the direction perpendicular to the substrate SUB.

Figure 4C:
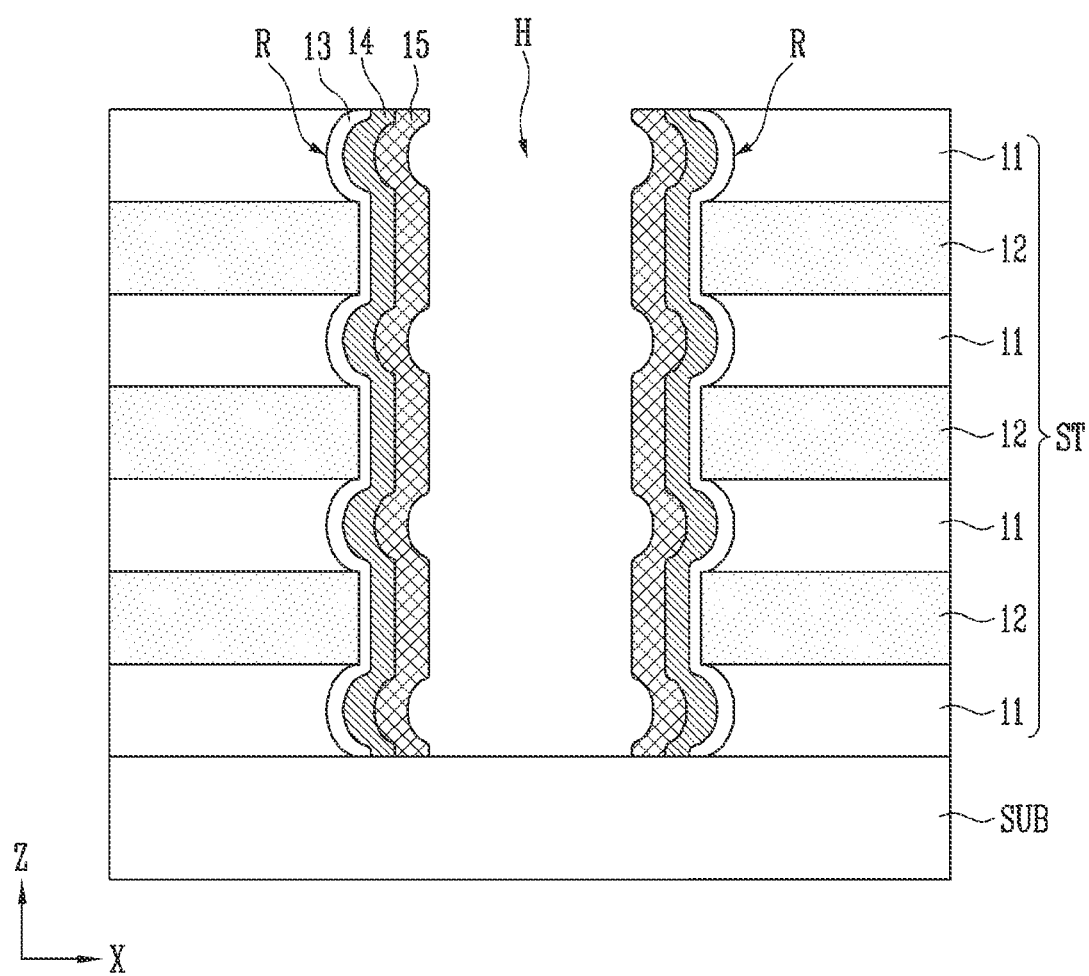

Referring to FIG. 4C, a gate insulating layer 13, a channel layer 14, and a variable resistance layer 15 are sequentially formed along the sidewall of the hole H having the uneven portion.

The gate insulating layer 13 may be formed of oxide. The channel layer 14 may be formed of poly-silicon. At least one of a phase variation material, a perovskite-based material, and a transition metal oxide such as $NiO_x$, $HfO_x$, $TaO_x$, $TiO_x$ or $SiHfO_x$ may be used for the variable resistance layer 15.

Since the channel layer 14 is formed along the sidewall of the hole H having the uneven portion, some regions of the channel layer 14 may be concavely formed toward a central portion of the hole H, and regions between the concavely formed regions may be relatively convexly formed. For example, the region of the channel layer 14, which is adjacent to the first material layer 11, may be defined as a concave region, and the region of the channel layer 14, which is adjacent to the second material layer 12, may be defined as a convex region. For example, in an embodiment, as shown in FIG. 4C, the region of the channel layer 14, which is adjacent to the first material layer 11, may be defined as a concave region, and the region of the channel layer 14, which is adjacent to the second material layer 12, may be defined as a convex region.

Figure 4D:
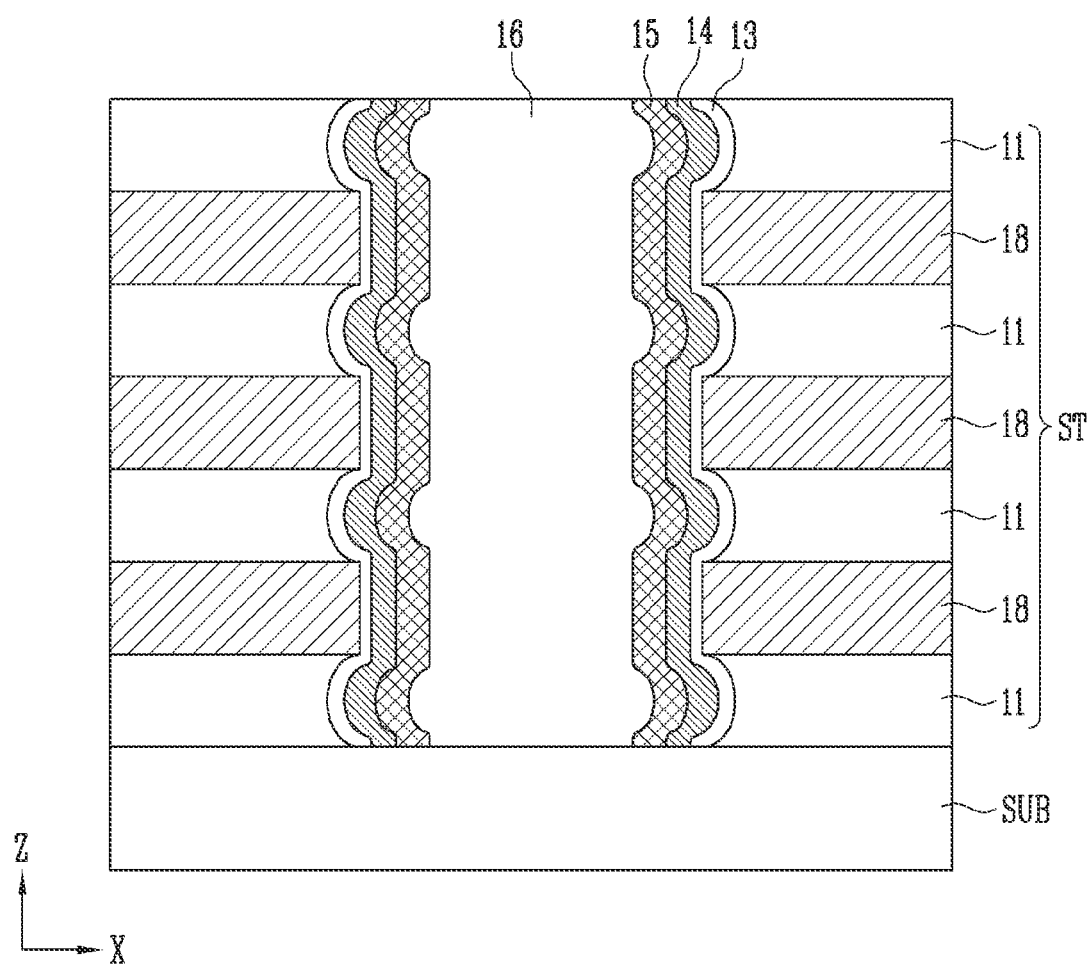

Referring to FIG. 4D, a vertical insulating layer 16 is formed such that the inside of the hole (H shown in FIG. 4C) is buried. The vertical insulating layer 16 may be formed of oxide.

Subsequently, the second material layers (12 shown in FIG. 4C) are replaced with third material layers 18. In an example, when the second material layers 12 include a sacrificial material and the first material layer 11 include an insulating material, the second material layers 12 may be replaced with conductive layers. The third material layer 18 may include a conductive material such as poly-silicon, tungsten, molybdenum or metal.

In another example, when the first material layers 11 include an insulating material and the second material layers 12 include a conductive material, the process of replacing the second material layers 12 with the third material layers 18 may be skipped.

Figure 5:
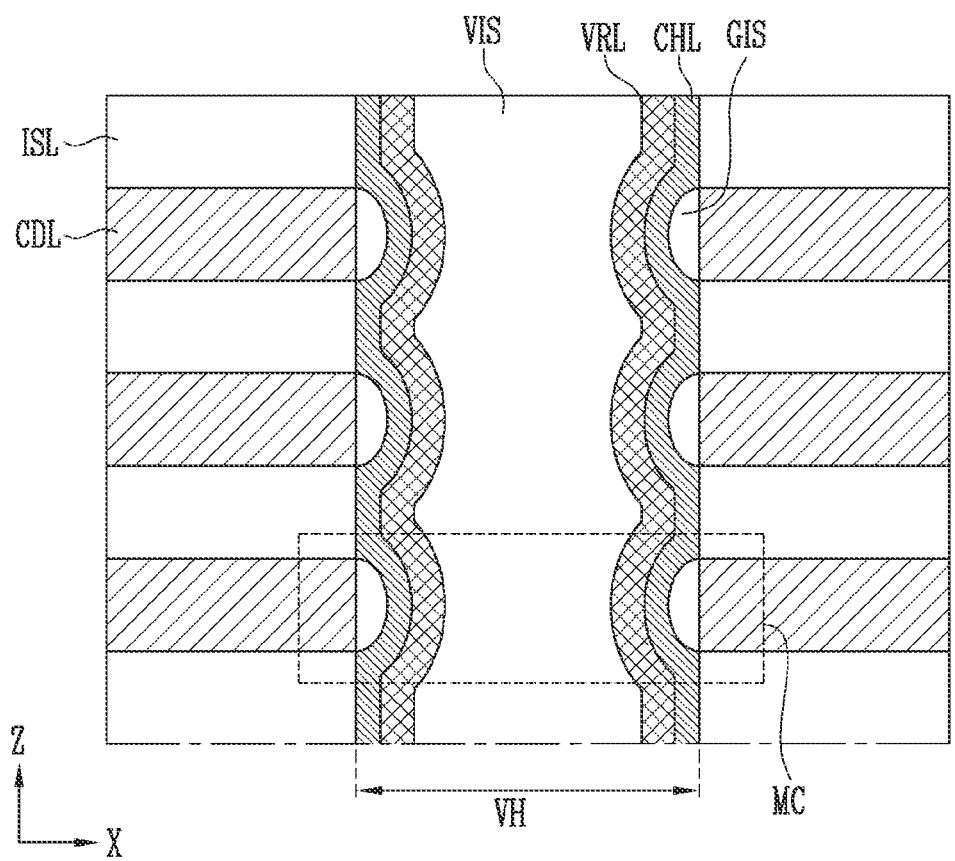
FIG. 5 is a sectional view illustrating a resistive memory device in accordance with another embodiment of the present disclosure.

FIG. 5 is a sectional view illustrating a resistive memory device in accordance with another embodiment of the present disclosure.

Referring to FIG. 5, the resistive memory device may include memory blocks including a plurality of resistive random access memory cells, and a portion of a string included in a memory block is illustrated in FIG. 5.

The string may include a plurality of resistive random access memory cells MC, and the plurality of resistive random access memory cells MC may be connected to conductive layers CDL that correspond to word lines. Interlayer insulating layers ISL may be formed between the conductive layers CDL. The conductive layers CDL and the interlayer insulating layers ISL may extend in an X direction as a direction parallel to a substrate. For example, the interlayer insulating layers ISL and the conductive layers CDL may be alternately stacked on the top of a lower structure (not shown). The lower structure may include the substrate or at least one of a source line, a source select line, and peripheral circuits, which are formed on the substrate. The conductive layers CDL may be used as word lines or select lines. For example, when assuming that the interlayer insulating layers ISL and the conductive layers CDL are alternately stacked on the substrate, the conductive layers CDL may include word lines and drain select lines. The interlayer insulating layers ISL may be formed of oxide, and the conductive layers CDL may be formed of a metal material such as tungsten.

A vertical hole VH penetrating the interlayer insulating layers ISL and the conductive layers CDL in a Z direction as a direction perpendicular to the substrate may be formed in the string, and a gate insulating layer GIS, a channel layer CHL, a variable resistance layer VRL, and a vertical insulating layer VIS may be formed inside the vertical hole VH.

The gate insulating layer GIS having a semicircular shape may be formed on each of sidewalls of the conductive layers CDL, which are adjacent to the vertical hole VH. For example, as shown in FIG. 5, the gate insulating layer GIS has a semicircular shape and is formed on each of the sidewalls of the conductive layers CDL, which are adjacent to the vertical hole VH. That is, the gate insulating layers GIS are formed only on the sidewalls of the conductive layers CDL, and might not be formed on sidewalls of the interlayer insulating layers ISL, which are adjacent to the vertical hole VH. That is, the gate insulating layers GIS adjacent to each other in a vertical direction may be spaced apart from each other with the sidewalls of the interlayer insulating layers ISL interposed therebetween. For example, as shown in FIG. 5, gate insulating layers GIS adjacent to each other in a vertical direction may be spaced apart from each other with the sidewalls of the interlayer insulating layers ISL interposed therebetween, in an embodiment.

Since the channel layer CHL and the variable resistance layer VRL are formed along the sidewalls of the interlayer insulating layers ISL and surfaces of the gate insulating layers GIS formed in the semicircular shape on the sidewalls of the conductive layers CDL, the channel layer CHL and the variable resistance layer VRL may have a form in which a plurality of uneven portions are disposed in the vertical direction. That is, the channel layer CHL may be formed in a wave pattern extending in the vertical direction.

In this embodiment, the variable resistance layer VRL may be used as a layer for storing data, and the channel layer CHL may be used to allow a current to flow in the string.

The gate insulating layer GIS and the vertical insulating layer VIS may be formed of oxide. The channel layer CHL may be formed of poly-silicon. At least one of a phase variation material, a perovskite-based material, and a transition metal oxide such as $NiO_x$, $HfO_x$, $TaO_x$, $TiO_x$ or $SiHfO_x$ may be used for the variable resistance layer VRL.

In accordance with the above-described embodiment, the gate insulating layers GIS having the semicircular shape are formed on the sidewalls of the conductive layers CDL corresponding to the respective resistive random access memory cells. Accordingly, in an embodiment, the channel layer CHL are formed along the gate insulating layers GIS, and hence a channel domination force of one transistor configured with the conductive layer DCL, the gate insulating layer GIS, and the channel layer CHL in one resistive random access memory cell MC is decreased. Accordingly, in an embodiment, an effective channel length of the resistive random access memory cell MC can be decreased.

FIGS. 6A to 6D are sectional views illustrating a manufacturing method of the resistive memory device in accordance with another embodiment of the present disclosure.

Figure 6A:
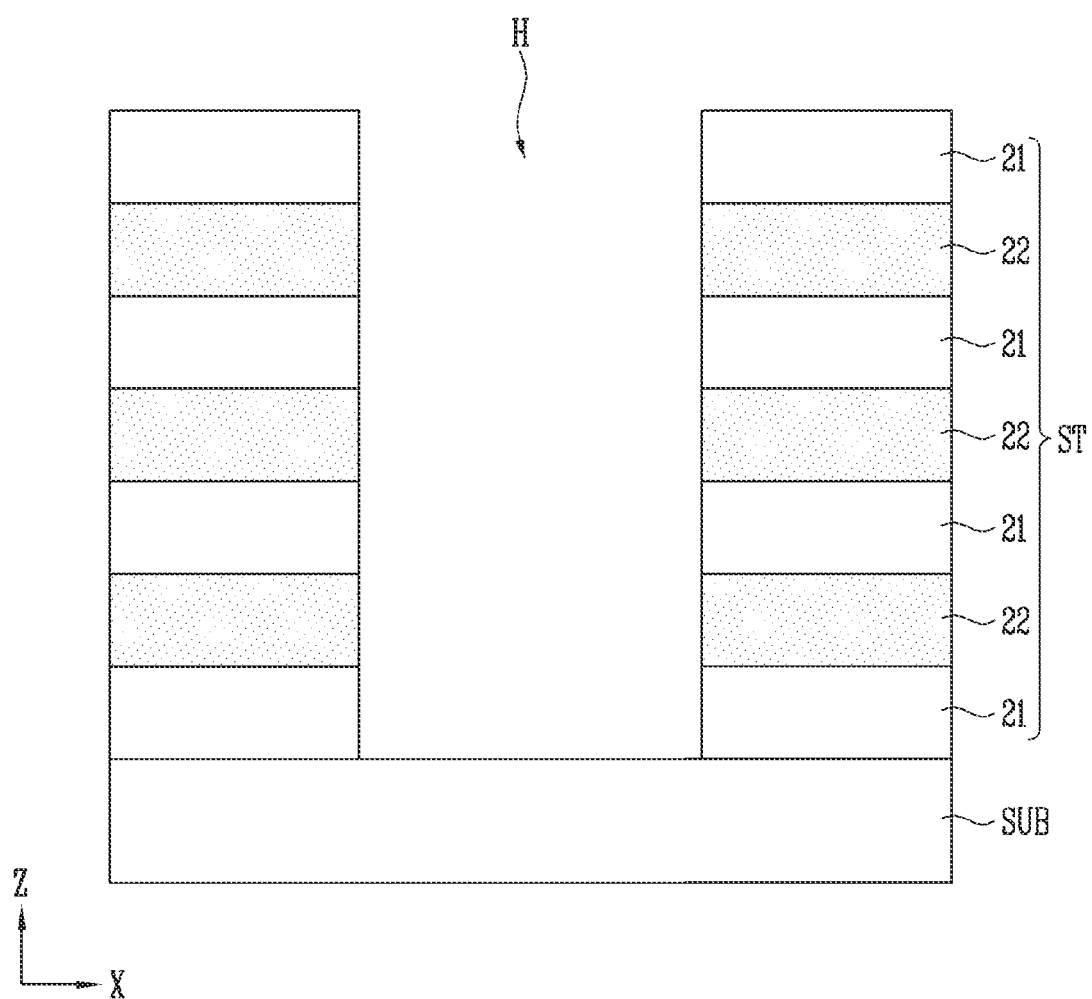

Referring to FIG. 6A, a stack structure ST is formed on a substrate SUB. The stack structure ST may include first material layers 21 and second material layers 22, which are alternately stacked. The first and second material layers 21 and 22 may extend in a first direction X as a direction horizontal to the substrate SUB. The first and second material layers 21 and 22 may be stacked in a second direction Z as a direction perpendicular to the substrate SUB. The first and second material layers 21 and 22 may be formed by using a deposition process such as Chemical Vapor Deposition (CVD).

The first material layers 21 may include a material having a high etch selectivity with respect to the second material layers 22. In an example, the first material layers 21 may include an insulating material such as oxide, and the second material layers 22 may include a sacrificial material such as nitride. In another example, the first material layers 21 may include an insulating material such as oxide, and the second material layers 22 may include a conductive material such as poly-silicon, tungsten, molybdenum or metal.

Subsequently, a hole H may be formed, which penetrates the stack structure ST. The hole H may have a cylindrical shape extending in the second direction Z.

Figure 6B:
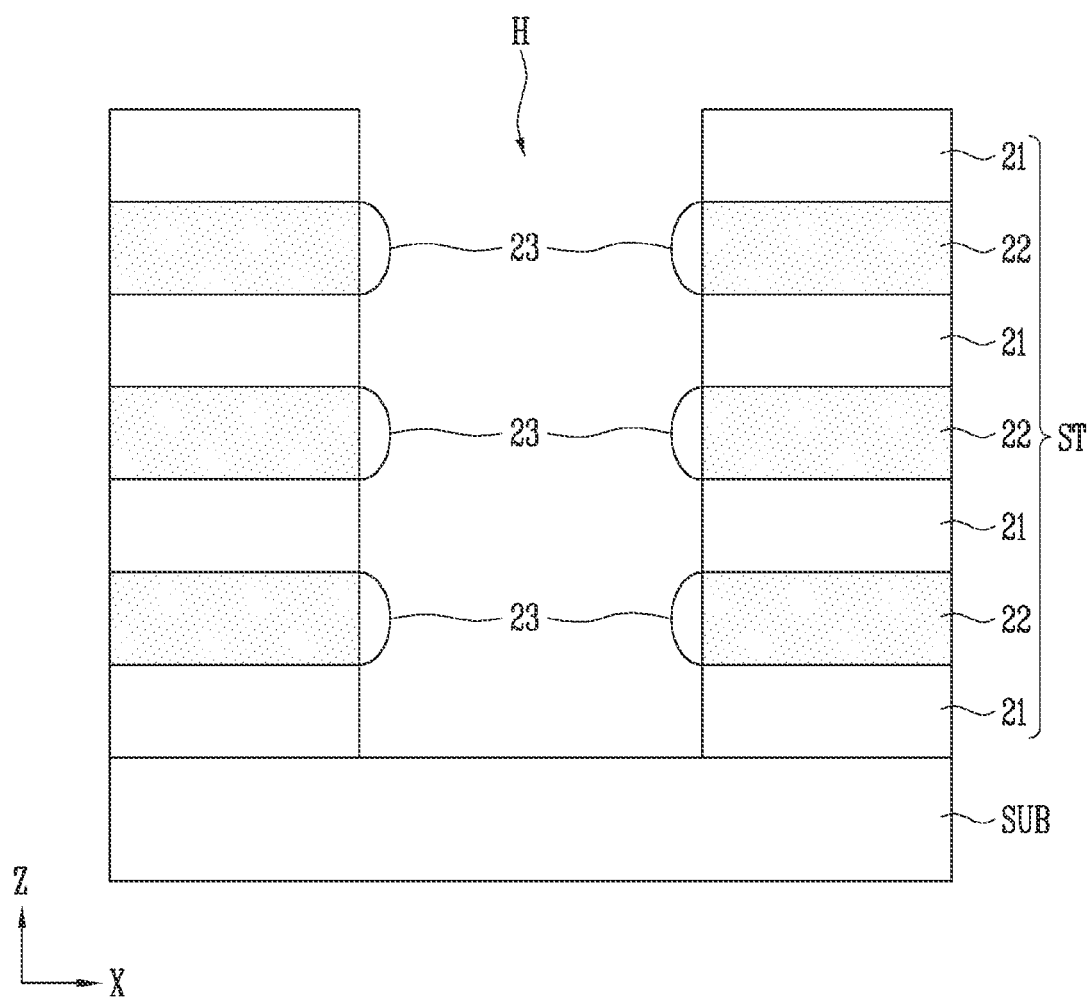

Referring to FIG. 6B, gate insulating layers 23 are selectively formed on sidewalls of the second material layers 22, which are exposed through the hole H by performing an oxidation process. The oxidation process may be preferably performed by using a radical oxidation process. The oxidation process may be preferably performed such that the gate insulating layers 23 having a semicircular shape are formed only on the sidewalls of the second material layers 22. The gate insulating layer 23 may be formed of oxide.

Exposed sidewall of the first material layers 21 and exposed sidewalls of the gate insulating layers 23 may be formed to have uneven portions through a process of forming the above-described gate insulating layers 23.

Referring to FIG. 6C, a channel layer 24 and a variable resistance layer 25 are sequentially formed along the exposed sidewalls of the first material layers 21 and the exposed sidewalls of the gate insulating layers 23.

The channel layer 24 may be formed of poly-silicon. At least one of a phase variation material, a perovskite-based material, and a transition metal oxide such as $NiO_x$, $HfO_x$, $TaO_x$, $TiO_x$ or $SiHfO_x$ may be used for the variable resistance layer 25.

Since the channel layer 24 is formed along the exposed sidewalls of the first material layers 21 and the exposed sidewalls of the gate insulating layers 23, which have the uneven portions, some regions of the channel layer 24 may be concavely formed toward a central portion of the hole H, and regions between the concavely formed regions may be relatively convexly formed. For example, the region of the channel layer 24, which is adjacent to the first material layer 21, may be defined as a concave region, and the region of the channel layer 24, which is adjacent to the second material layer 22, may be defined as a convex region.

A vertical insulating layer 26 may be formed such that the inside of the hole (H shown in FIG. 6B) is buried. The vertical insulating layer 26 may be formed of oxide.

Figure 6D:
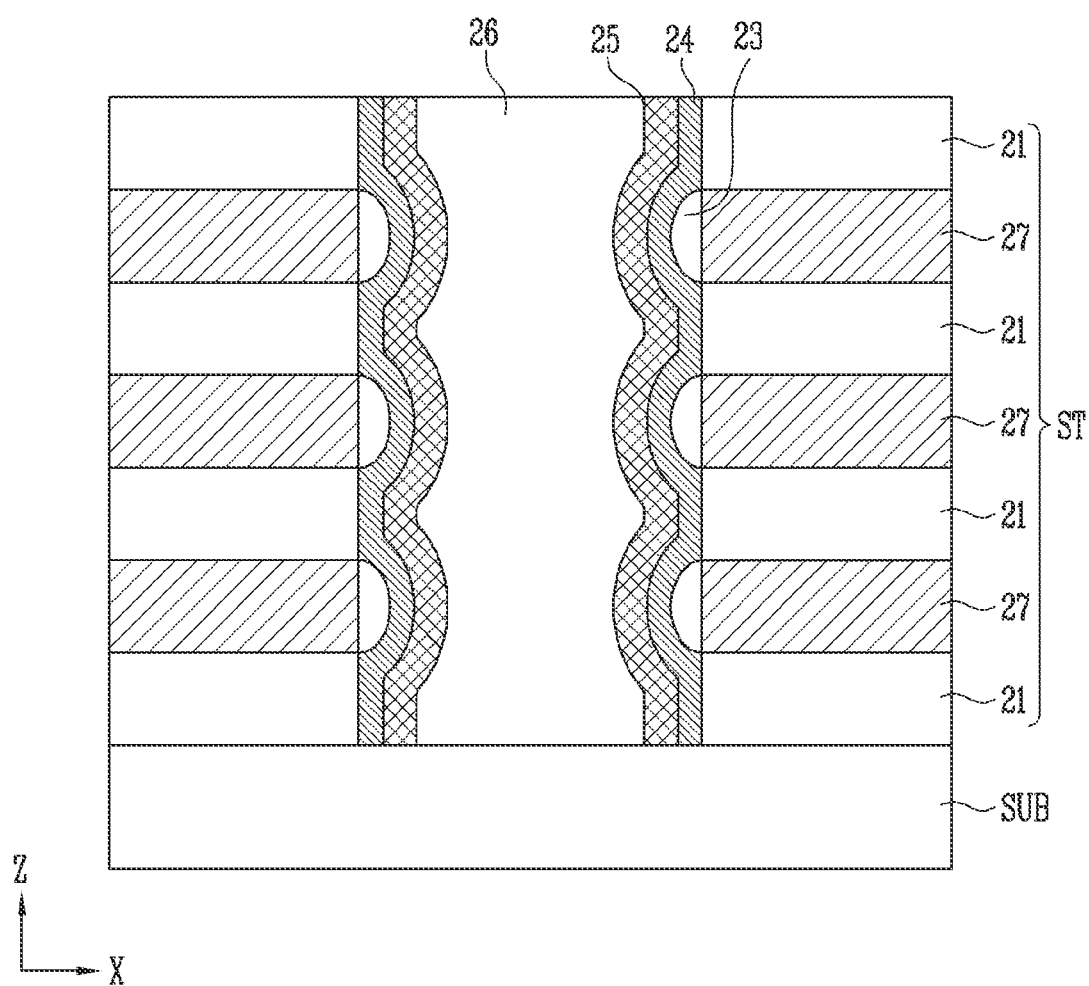

Referring to FIG. 6D, the second material layers (22 shown in FIG. 6C) are replaced with third material layers 27. In an example, when the second material layers 22 include a sacrificial material and the first material layer 21 include an insulating material, the second material layers 22 may be replaced with conductive layers. The third material layer 27 may include a conductive material such as poly-silicon, tungsten, molybdenum or metal.

In another example, when the first material layers 21 include an insulating material and the second material layers 22 include a conductive material, the process of replacing the second material layers 22 with the third material layers 27 may be skipped.

Figure 7:
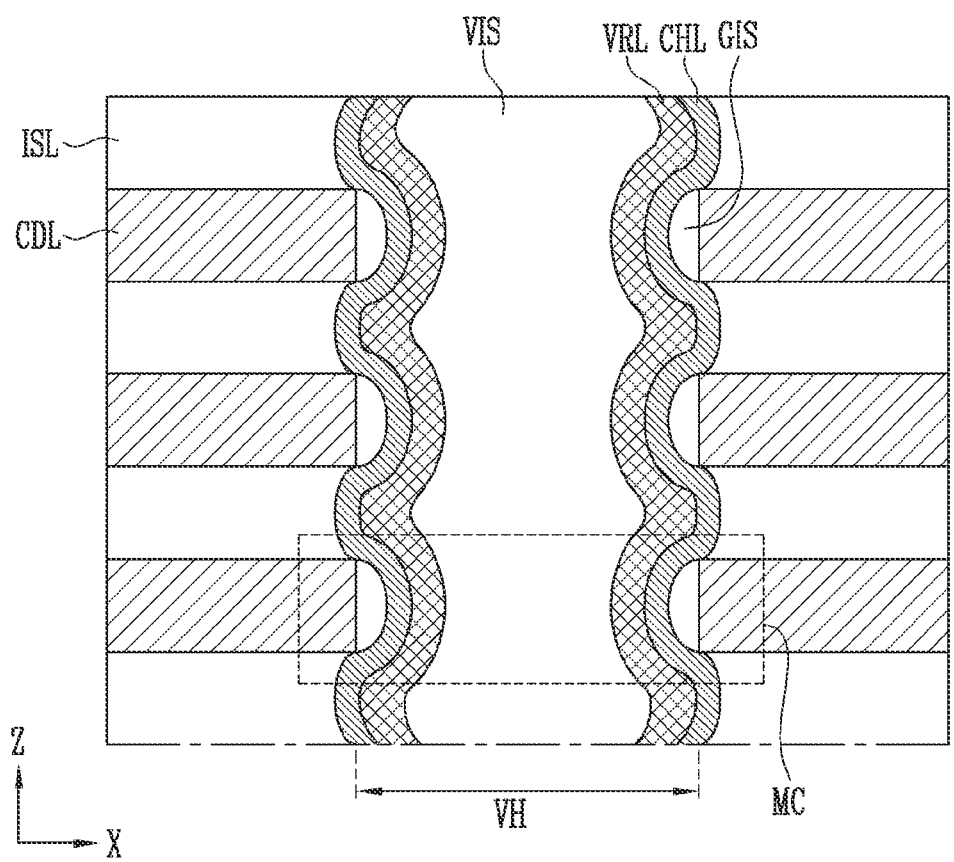
FIG. 7 is a sectional view illustrating a resistive memory device in accordance with still another embodiment of the present disclosure.

FIG. 7 is a sectional view illustrating a resistive memory device in accordance with still another embodiment of the present disclosure.

Referring to FIG. 7, the resistive memory device may include memory blocks including a plurality of resistive random access memory cells, and a portion of a string included in a memory block is illustrated in FIG. 7.

The string may include a plurality of resistive random access memory cells MC, and the plurality of resistive random access memory cells MC may be connected to conductive layers CDL that correspond to word lines. Interlayer insulating layers ISL may be formed between the conductive layers CDL. The conductive layers CDL and the interlayer insulating layers ISL may extend in an X direction as a direction parallel to a substrate. For example, the interlayer insulating layers ISL and the conductive layers CDL may be alternately stacked on the top of a lower structure (not shown). The lower structure may include the substrate or at least one of a source line, a source select line, and peripheral circuits, which are formed on the substrate. The conductive layers CDL may be used as word lines or select lines. For example, when assuming that the interlayer insulating layers ISL and the conductive layers CDL are alternately stacked on the substrate, the conductive layers CDL may include word lines and drain select lines. The interlayer insulating layers ISL may be formed of oxide, and the conductive layers CDL may be formed of a metal material such as tungsten.

A vertical hole VH penetrating the interlayer insulating layers ISL and the conductive layers CDL in a Z direction as a direction perpendicular to the substrate may be formed in the string, and sidewalls of the interlayer insulating layers ISL, which are adjacent to the vertical hole VH, may have a concave shape. A gate insulating layer GIS, a channel layer CHL, a variable resistance layer VRL, and a vertical insulating layer VIS may be formed inside the vertical hole VH. For example, the vertical hole VH may be formed in a cylindrical shape, and a sidewall of the vertical hole VH may be formed to have uneven portions due to the conductive layers CDL having vertical sidewalls and the interlayer insulating layers ISL having concave sidewalls. That is, the sidewall of the vertical hole VH may have a form in which a plurality of uneven portions are disposed in a vertical direction.

The gate insulating layer GIS having a semicircular shape may be formed on each of sidewalls of the conductive layers CDL, which are adjacent to the vertical hole VH. That is, the gate insulating layers GIS are formed only on the sidewalls of the conductive layers CDL, and might not be formed on sidewalls of the interlayer insulating layers ISL, which are adjacent to the vertical hole VH. That is, the gate insulating layers GIS adjacent to each other in a vertical direction may be spaced apart from each other with the sidewalls of the interlayer insulating layers ISL interposed therebetween.

Since the channel layer CHL and the variable resistance layer VRL are formed along the sidewalls of the interlayer insulating layers ISL and surfaces of the gate insulating layers GIS formed in the semicircular shape on the sidewalls of the conductive layers CDL, the channel layer CHL and the variable resistance layer VRL may have a form in which a plurality of uneven portions are disposed in the vertical direction. That is, the channel layer CHL may be formed in a wave pattern extending in the vertical direction.

In this embodiment, the variable resistance layer VRL may be used as a layer for storing data, and the channel layer CHL may be used to allow a current to flow in the string.

The gate insulating layer GIS and the vertical insulating layer VIS may be formed of oxide. The channel layer CHL may be formed of poly-silicon. At least one of a phase variation material, a perovskite-based material, and a transition metal oxide such as $NiO_x$, $HfO_x$, $TaO_x$, $TiO_x$ or $SiHfO_x$ may be used for the variable resistance layer VRL.

In accordance with the above-described embodiment, the conductive layers CDL respectively corresponding to the resistive random access memory cells MC have a structure further protruding toward the vertical hole VH than the interlayer insulating layers ISL, and the gate insulating layers GIS having the semicircular shape are formed on the sidewalls of the conductive layers CDL corresponding to the respective resistive random access memory cells. Accordingly, in an embodiment, the channel layer CHL is formed along the gate insulating layers GIS, and hence a channel domination force of one transistor configured with the conductive layer DCL, the gate insulating layer GIS, and the channel layer CHL in one resistive random access memory cell MC is decreased. Accordingly, in an embodiment, an effective channel length of the resistive random access memory cell MC can be decreased. Thus, in an embodiment, a bias for a program-erase operation of an element can be decreased, and the variable resistance layers VRL corresponding to the respective resistive random access memory cells MC are physically spaced apart from each other, thereby improving an inter-cell interference phenomenon.

FIGS. 8A to 8E are sectional views illustrating a manufacturing method of the resistive memory device in accordance with still another embodiment of the present disclosure.

Figure 8A:
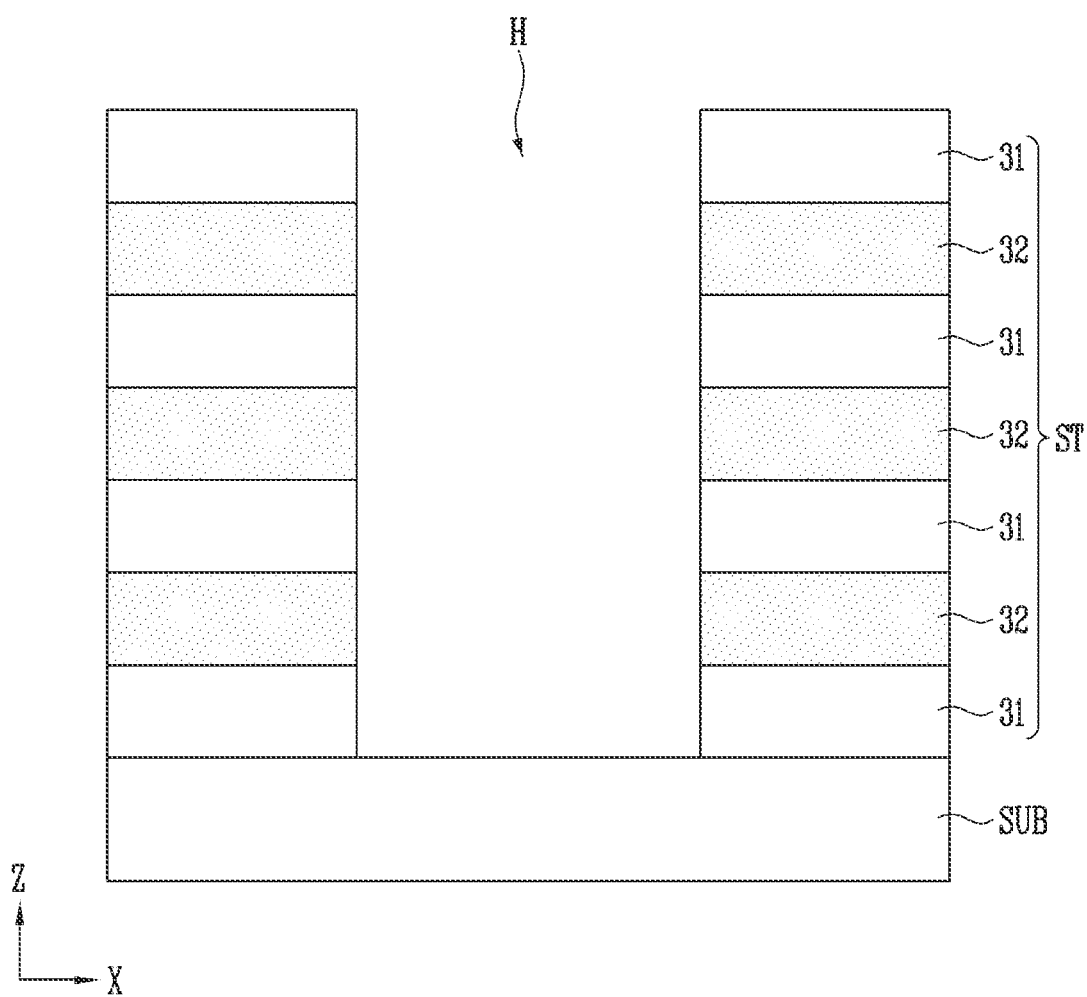
FIGS. 8A, 8B, 8C, 8D, and 8E are sectional views illustrating a manufacturing method of the resistive memory device in accordance with still another embodiment of the present disclosure.

Referring to FIG. 8A, a stack structure ST is formed on a substrate SUB. The stack structure ST may include first material layers 31 and second material layers 32, which are alternately stacked. The first and second material layers 31 and 32 may extend in a first direction X as a direction horizontal to the substrate SUB. The first and second material layers 31 and 32 may be stacked in a second direction Z as a direction perpendicular to the substrate SUB. The first and second material layers 31 and 32 may be formed by using a deposition process such as Chemical Vapor Deposition (CVD).

The first material layers 31 may include a material having a high etch selectivity with respect to the second material layers 32. In an example, the first material layers 31 may include an insulating material such as oxide, and the second material layers 32 may include a sacrificial material such as nitride. In another example, the first material layers 31 may include an insulating material such as oxide, and the second material layers 32 may include a conductive material such as poly-silicon, tungsten, molybdenum or metal.

Subsequently, a hole H may be formed, which penetrates the stack structure ST. The hole H may have a cylindrical shape extending in the second direction Z.

Figure 8B:
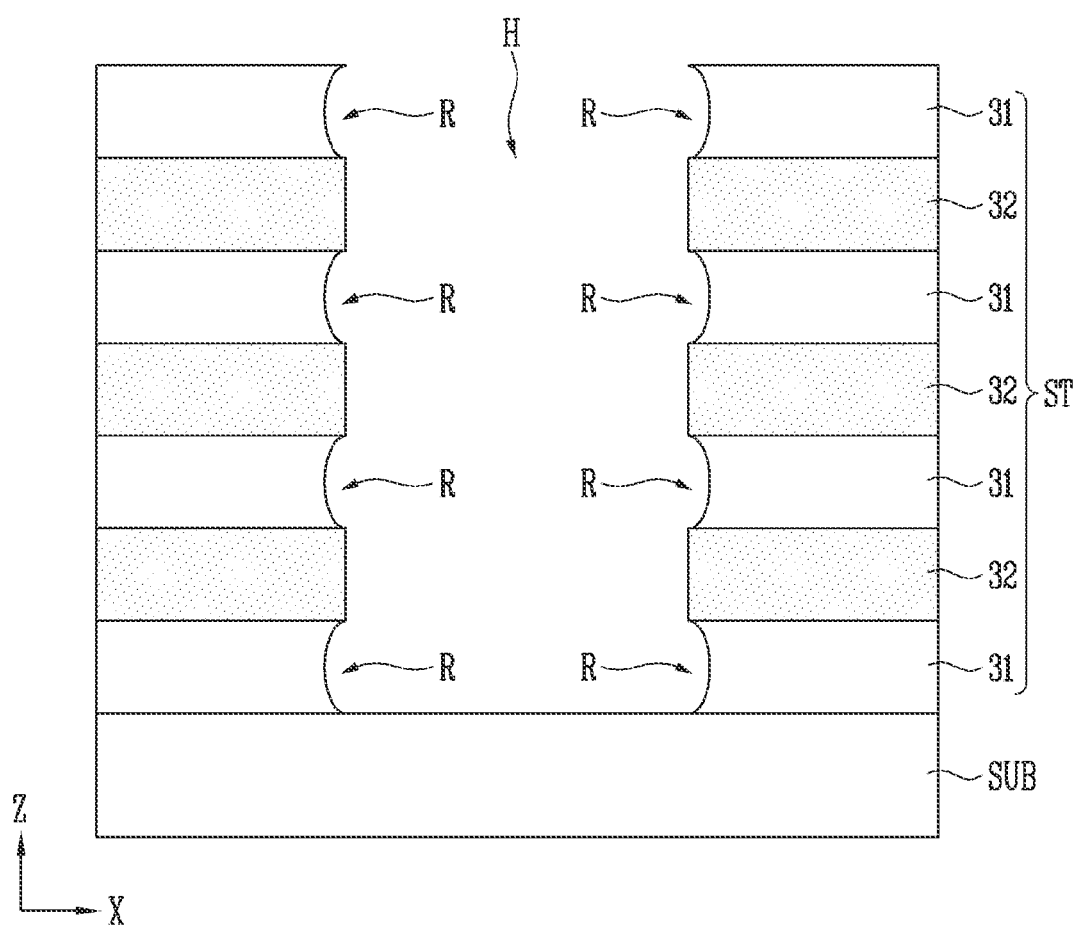

Referring FIG. 8B, recess regions R are formed by etching sidewalls of the first material layers 31, which are exposed through the hole H, to a certain depth. That is, the sidewalls of the first material layers 31 are etched to a certain depth such that the second material layers 32 further protrude in a horizontal direction than the first material layers 31. The sidewalls of the first material layers 31 may be concavely etched in a round shape.

Figure 8C:
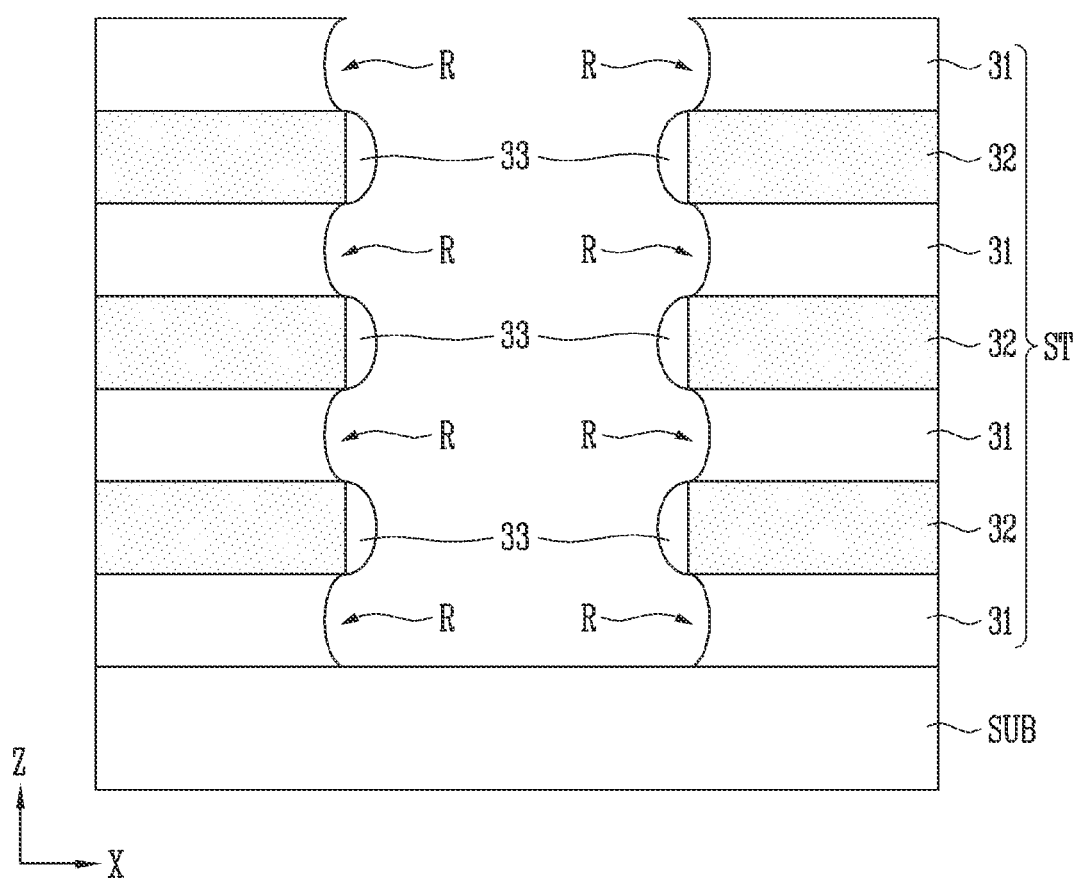

Referring to FIG. 8C, gate insulating layers 33 are selectively formed on sidewalls of the second material layers 32, which are exposed through the hole (H shown in FIG. 8B) by performing an oxidation process. The oxidation process may be preferably performed by using a radical oxidation process. The oxidation process may be preferably performed such that the gate insulating layers 33 having a semicircular shape are formed only on the sidewalls of the second material layers 32. The gate insulating layer 33 may be formed of oxide.

Exposed sidewall of the first material layers 31 and exposed sidewalls of the gate insulating layers 33 may be formed to have uneven portions through a process of forming the above-described gate insulating layers 33.

Figure 8D:
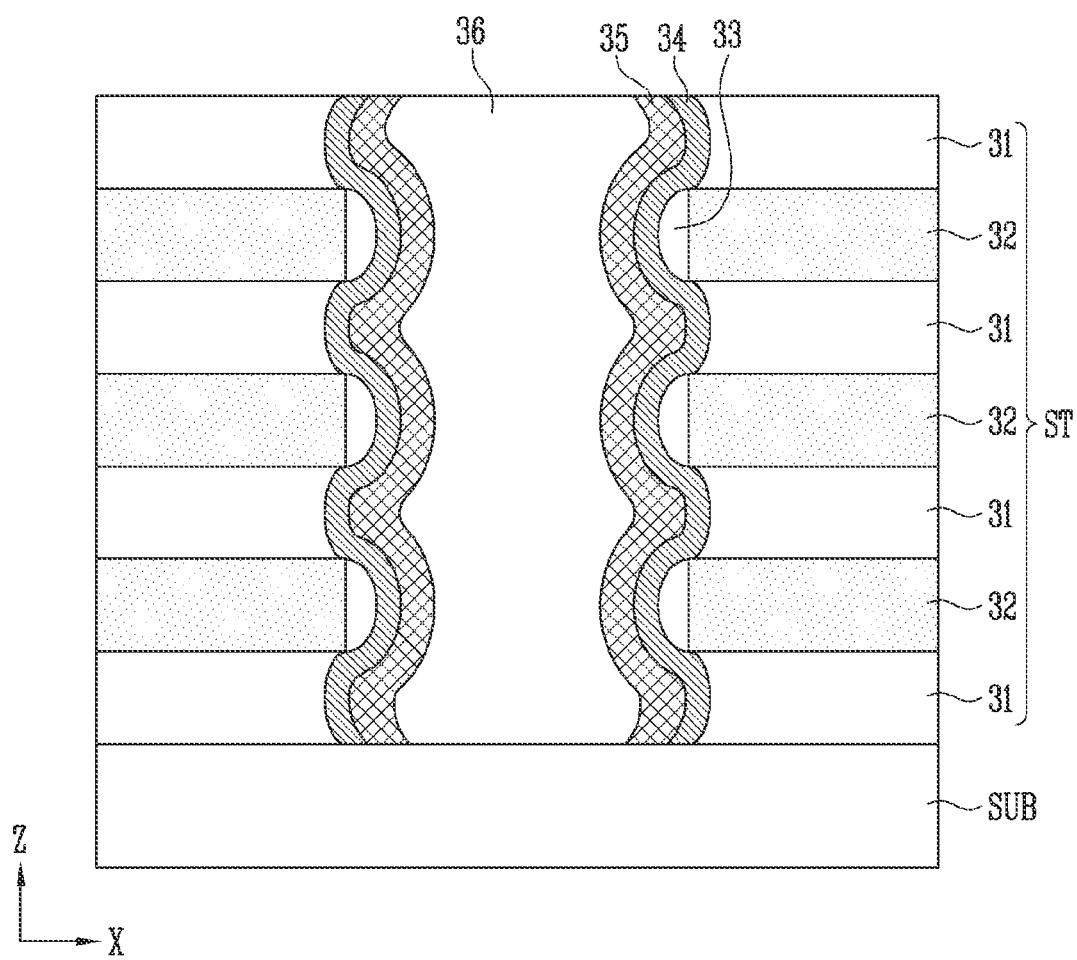

Referring to FIG. 8D, a channel layer 34 and a variable resistance layer 35 are sequentially formed along the concave sidewalls of the first material layers 31 and the exposed sidewalls of the gate insulating layers 33.

The channel layer 34 may be formed of poly-silicon. At least one of a phase variation material, a perovskite-based material, and a transition metal oxide such as $NiO_x$, $HfO_x$, $TaO_x$, $TiO_x$ or $SiHfO_x$ may be used for the variable resistance layer 35.

Since the channel layer 34 is formed along the exposed sidewalls of the first material layers 31 and the exposed sidewalls of the gate insulating layers 33, which have the uneven portions, some regions of the channel layer 34 may be concavely formed toward a central portion of the hole H, and regions between the concavely formed regions may be relatively convexly formed. For example, the region of the channel layer 34, which is adjacent to the first material layer 31, may be defined as a concave region, and the region of the channel layer 34, which is adjacent to the second material layer 32, may be defined as a convex region.

Subsequently, a vertical insulating layer 36 may be formed such that the inside of the hole is buried. The vertical insulating layer 36 may be formed of oxide.

Figure 8E:
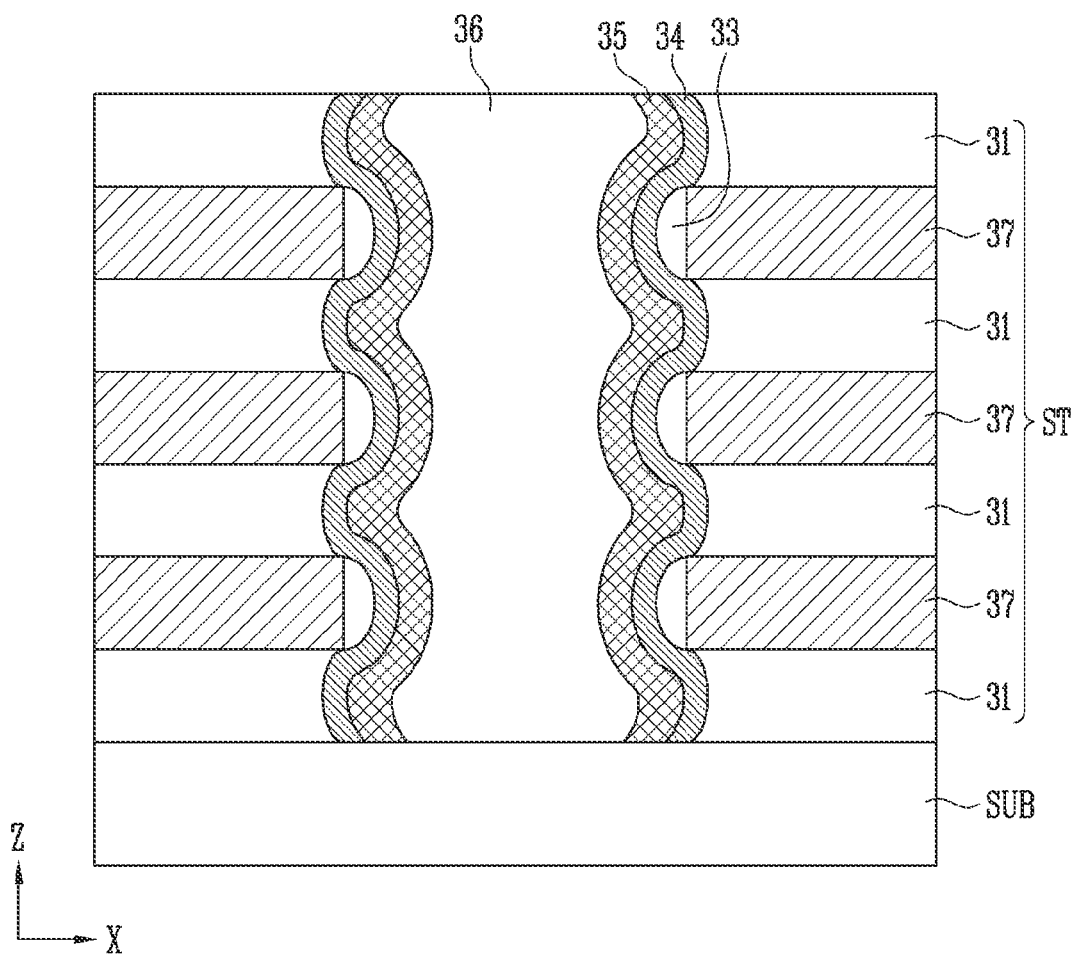

Referring to FIG. 8E, the second material layers (32 shown in FIG. 8D) are replaced with third material layers 37. In an example, when the second material layers 32 include a sacrificial material and the first material layer 31 include an insulating material, the second material layers 32 may be replaced with conductive layers. The third material layer 37 may include a conductive material such as poly-silicon, tungsten, molybdenum or metal.

In another example, when the first material layers 31 include an insulating material and the second material layers 32 include a conductive material, the process of replacing the second material layers 32 with the third material layers 37 may be skipped.

Figure 9:
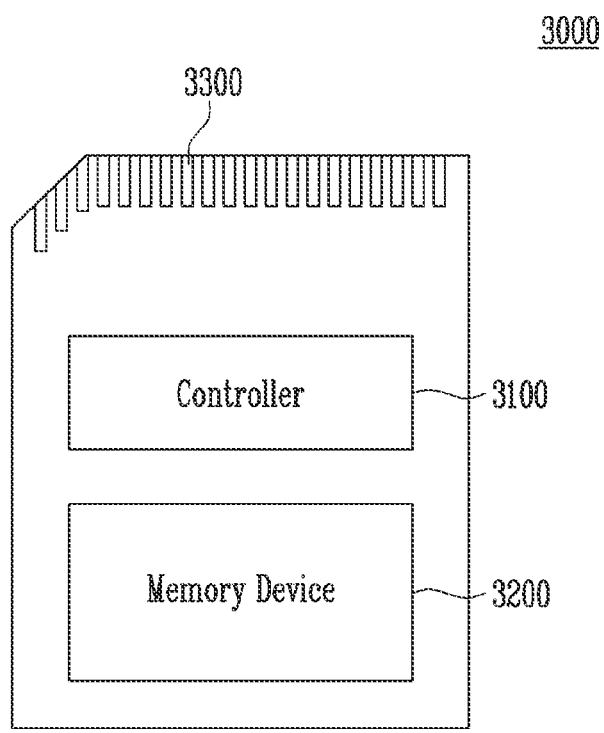
FIG. 9 is a diagram illustrating a memory card system to which the resistive memory device of the present disclosure is applied.

FIG. 9 is a diagram illustrating a memory card system to which the resistive memory device of the present disclosure is applied.

Referring to FIG. 9, the memory card system 3000 includes a controller 3100, a memory device 3200, and a connector 3300.

The controller 3100 may be connected to the memory device 3200. The controller 3100 may access the memory device 3200, For example, the controller 3100 may control a program, read or ease operation, or control a background operation of the memory device 3200. The controller 3100 may provide an interface between the memory device 3200 and a host. The controller 3100 may drive firmware for controlling the memory device 3200. For example, the controller 3100 may include components such as a Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. For example, the controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. For example, the connector 3300 may be defined by at least one of the above-described various communication protocols.

The memory device 3200 may include resistive random access memory cells, and be configured identically to the resistive memory device 1100 shown in FIG. 1.

The controller 3100 and the memory device 3200 may be integrated into a single semiconductor device, to constitute a memory card. For example, the controller 3100 and the memory device 3200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 10:
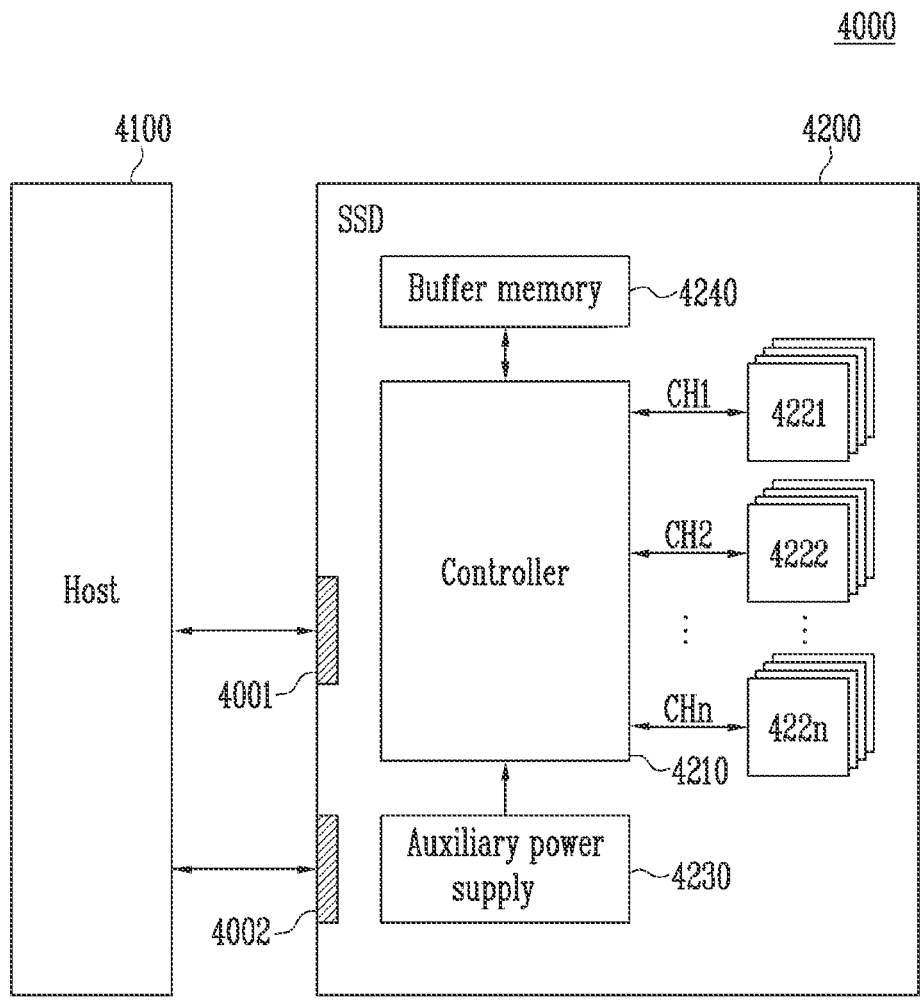
FIG. 10 is a diagram illustrating a Solid State Drive (SSD) system to which the resistive memory device of the present disclosure is applied.

FIG. 10 is a diagram illustrating a Solid State Drive (SSD) system to which the resistive memory device of the present disclosure is applied.

Referring to FIG. 10, the SSD system 4000 includes a host 4100 and an SSD 4200. The SSD 4200 exchanges a signal with the host 4100 through a signal connector 4001, and receives power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. For example, the signal may be a signal based on an interface between the host 4100 and the SSD 4200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may be configured to store data, and include resistive random access memory cells. Each of the plurality of memory devices 4221 to 422n may be configured identically to the resistive memory device 1100 shown in FIG. 1.

The auxiliary power supply 4230 may be connected to the host 4100 through the power connector 4002. The auxiliary power supply 4230 may receive power PWR input from the host 4100 and charge the power PWR. When the supply of power from the host 4100 is interrupted, the auxiliary power supply 4230 may provide power of the SSD 4200. For example, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as a buffer memory of the SSD 4200. For example, the buffer memory 4240 may temporarily store data received from the host 4100 or data received from the plurality of memory devices 4221 to 422n, or temporarily store meta data (e.g., a mapping table) of the memory devices 4221 to 422n. The buffer memory 4240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

In accordance with the present disclosure, a channel domination force of a transistor is decreased, so that an effective channel length of a resistive random access memory cell can be decreased. Accordingly, in an embodiment, a bias used to store or erase data in or from a resistive memory device of the resistive random access memory cell can be decreased, thereby improving operation characteristics of the resistive memory device.

While the present disclosure has been shown and described with reference to certain examples of embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described examples of embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A resistive memory device comprising:
   a stack structure in which a plurality of interlayer insulating layers and a plurality of conductive layers are alternately stacked;
   a hole penetrating the stack structure in a vertical direction; and
   a gate insulating layer, a channel layer, and a variable resistance layer, formed along sidewalls of the plurality of conductive layers, which are adjacent to the hole, and sidewalls of the plurality of interlayer insulating layers, which are adjacent to the hole,
   wherein all of the sidewalls of the plurality of interlayer insulating layers, which are adjacent to the hole, have a concave shape and all of the sidewalls of the plurality of conductive layers, which are adjacent to the hole, have a flat shape.

2. The resistive memory device of claim 1, wherein the channel layer comprises a wave pattern extending in the vertical direction.

3. The resistive memory device of claim 1, wherein the channel layer comprises concave regions adjacent to the plurality of interlayer insulating layers and convex regions adjacent to the plurality of conductive layers.

4. The resistive memory device of claim 1, wherein the plurality of conductive layers comprise a structure further protruding toward a central portion of the hole than the plurality of interlayer insulating layers.

5. A resistive memory device comprising:
   a stack structure in which a plurality of interlayer insulating layers and a plurality of conductive layers are alternately stacked;
   a hole penetrating the stack structure in a vertical direction;
   gate insulating layers disposed between the hole and the respective plurality of conductive layers; and
   a channel layer and a variable resistance layer, sequentially formed along sidewalls of the plurality of interlayer insulating layers, which are adjacent to the hole, and sidewalls of the gate insulating layers, which are adjacent to the hole,
   wherein the gate insulating layers correspond to respective ones of the plurality of conductive layers, and adjacent gate insulating layers are physically separated from each other by the channel layer in contact with the plurality of interlayer insulating layers.

6. The resistive memory device of claim 5, wherein the sidewalls of the gate insulating layers comprise a semicircular shape.

7. The resistive memory device of claim 5, wherein the sidewalls of the plurality of interlayer insulating layers, which are adjacent to the hole, comprise a concave shape.

8. The resistive memory device of claim 5, wherein the channel layer comprises a wave pattern extending in the vertical direction.

9. The resistive memory device of claim 5, wherein the channel layer comprises concave regions adjacent to the plurality of interlayer insulating layers and convex regions adjacent to the plurality of conductive layers.

10. The resistive memory device of claim 5, wherein the plurality of conductive layers comprise a structure further protruding toward a central portion of the hole than the plurality of interlayer insulating layers.

* * * * *